(12) United States Patent
Park et al.

(10) Patent No.: US 11,854,622 B2
(45) Date of Patent: Dec. 26, 2023

(54) ELECTRICAL FUSE ONE TIME PROGRAMMABLE (OTP) MEMORY

(71) Applicant: KEY FOUNDRY CO., LTD., Cheongju-si (KR)

(72) Inventors: Seong Jun Park, Suwon-si (KR); Jong Min Cho, Cheongju-si (KR); Sung Bum Park, Seongnam-si (KR); Kee Sik Ahn, Hwaseong-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 151 days.

(21) Appl. No.: 17/537,981

(22) Filed: Nov. 30, 2021

(65) Prior Publication Data
US 2023/0048824 A1 Feb. 16, 2023

(30) Foreign Application Priority Data
Aug. 4, 2021 (KR) .................. 10-2021-0102526

(51) Int. Cl.
| | | |
|---|---|---|
| G11C 16/10 | (2006.01) | |
| G11C 16/26 | (2006.01) | |
| G11C 17/16 | (2006.01) | |
| G11C 16/08 | (2006.01) | |
| G11C 16/24 | (2006.01) | |

(52) U.S. Cl.
CPC ............ *G11C 16/102* (2013.01); *G11C 16/08* (2013.01); *G11C 16/24* (2013.01); *G11C 16/26* (2013.01); *G11C 17/16* (2013.01)

(58) Field of Classification Search
None
See application file for complete search history.

(56) References Cited

U.S. PATENT DOCUMENTS

| | | | | |
|---|---|---|---|---|
| 7,002,219 | B1* | 2/2006 | de Jong | .............. H01L 23/5256 |
| | | | | 365/96 |
| 7,710,813 | B1 | 5/2010 | Im et al. | |
| 9,082,475 | B2 | 7/2015 | Kim | |
| 10,163,783 | B1* | 12/2018 | Chang | ................. H01H 85/046 |
| 10,535,602 | B2 | 1/2020 | Chang et al. | |
| 2008/0186789 | A1* | 8/2008 | Sumi | ...................... G11C 17/18 |
| | | | | 365/225.7 |

(Continued)

FOREIGN PATENT DOCUMENTS

| KR | 10-2011-0078735 A | 7/2011 |
|---|---|---|
| KR | 10-2013-0090714 A | 8/2013 |

OTHER PUBLICATIONS

Korean Office Action dated Oct. 17, 2022, in counterpart Korean Patent Application No. 10-2021-0102526 (5 pages in Korean).

*Primary Examiner* — Tan T. Nguyen
(74) *Attorney, Agent, or Firm* — NSIP Law

(57) ABSTRACT

An eFuse cell is provided. The eFuse cell may include a first PMOS transistor and a first NMOS transistor configured to receive a programmed state selection (BLOWB) signal, a second PMOS transistor and a second NMOS transistor configured to receive a write word line bar (WWLB) for a program operation, a first read NMOS transistor and a second read NMOS transistor configured to receive a read word line (RWL) for a read operation, a program transistor configured to control a program current to flow for a fusing operation, and an eFuse connected between the first read NMOS transistor and the second read NMOS transistor.

14 Claims, 9 Drawing Sheets

(56) References Cited

U.S. PATENT DOCUMENTS

2020/0350000 A1   11/2020  Yang
2022/0052058 A1*  2/2022  Chang .................... H10B 20/20
2023/0138308 A1*  5/2023  Seshadri ................ G11C 17/18
                                                                            257/529

* cited by examiner

ELECTRICAL FUSE ONE TIME PROGRAMMABLE (OTP) MEMORY

CROSS-REFERENCE TO RELATED APPLICATIONS

This application claims the benefit under 35 U.S.C. § 119 of Korean Patent Application No. 10-2021-0102526 filed on Aug. 4, 2021, in the Korean Intellectual Property Office, the entire disclosure of which is incorporated herein by reference for all purposes.

BACKGROUND

1. Field

The following description relates to an electrical fuse (eFuse) cell and an eFuse One Time Programmable (OTP) memory including the same.

2. Description of Related Art

A power Integrated Circuit (IC) such as a PMIC (Power Management IC) may utilize a non-volatile OTP (One Time Programmable) memory. An eFuse OTP memory that includes a small area and a simple operation system for a non-volatile OTP memory is frequently implemented.

An eFuse OTP memory may make an overcurrent flow to a metal fuse or a poly-silicon fuse approximately 10 mA-30 mA, may program a fuse by blowing it, and may determine data using resistance values before and after the program.

A plurality of transistors may be implemented to perform multiple functions in an eFuse unit cell of the eFuse OTP memory device. Since many transistors may be utilized in an eFuse cell, an area of an eFuse OTP memory device may be enlarged. Therefore, a problem may occur where an area of a cell array that is composed of a unit cell may become enlarged. Thus, it may be difficult to design a small memory device, thereby resulting in declines in product competitiveness in which a memory device is applied.

SUMMARY

This summary is supplied to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, an electrical fuse (eFuse) One Time Programmable (OTP) memory includes an eFuse cell including a first PMOS transistor and a first NMOS transistor configured to receive a programmed state selection (BLOWB) signal; a second PMOS transistor and a second NMOS transistor configured to receive a write word line bar (WWLB) signal to execute a program operation; a first read NMOS transistor and a second NMOS transistor configured to receive a read word line (RWL) signal to execute a read operation; a fuse connected between the first read NMOS transistor and the second read NMOS transistor; and a program transistor configured to control a flow of a program current to program the fuse.

The program transistor may be turned on and the fuse may be programmed when a low signal is applied to the programmed state selection (BLOWB) signal, the write word line bar (WWLB) signal, and the read word line (RWL) signal, in a program operation implementing the eFuse cell.

A read current path may be formed through the first read NMOS transistor, the fuse, and the second read NMOS transistor, when a high voltage is applied to the programmed state selection (BLOWB) signal, the write word line bar (WWLB) signal and the read word line (RWL) signal, in a read operation implementing the eFuse cell.

The eFuse OTP memory may further include a word line driver, the word line driver may be configured to activate the write word line bar (WWLB) signal and the read word line (RWL) signal and supply the activated write word line bar (WWLB) signal and the activated read word line (RWL) signal to the eFuse cell, and the write word line bar (WWLB) signal may maintain a high level state, and the read word line (RWL) signal may maintain a low level state in an address disable state.

In a general aspect, an electrical fuse (eFuse) One Time Programmable OTP memory includes an eFuse cell comprising a first region and a second region, wherein the first region comprises a first PMOS transistor, a second PMOS transistor, a first NMOS transistor, and a second NMOS transistor, wherein a programmed state selection (BLOWB) signal is configured to be supplied to a gate of the first PMOS transistor, and a power voltage is configured to be supplied to a first terminal of the first PMOS transistor, and a second terminal of the first PMOS transistor is connected to the second PMOS transistor, wherein a write word line bar (WWLB) signal is configured to be supplied to a gate of the second PMOS transistor, and a first terminal of the second PMOS transistor is connected to the first PMOS transistor, and a second terminal of the second PMOS transistor is connected to a first common node, wherein the programmed state selection (BLOWB) signal is configured to be supplied to a gate of the first NMOS transistor, and a first terminal of the first NMOS transistor is connected to the second PMOS transistor, and a second terminal of the first NMOS transistor is connected to a ground voltage, wherein the write word line bar (WWLB) signal is configured to be supplied to a gate of the second NMOS transistor, and a first terminal of the second NMOS transistor is connected to the first common node, and a second terminal of the second NMOS transistor is connected to the ground voltage.

The second region may include a first read NMOS transistor, a second read NMOS transistor, a program transistor, and a fuse, wherein a read word line (RWL) signal may be configured to be supplied to a gate of the first read NMOS transistor, and a bit line signal is configured to be supplied to a first terminal of the first read NMOS transistor, and a second terminal of the first read NMOS transistor is connected to the fuse through a second common node, wherein the read word line (RWL) signal may be configured to be supplied to a gate of the second read NMOS transistor, and a first terminal of the second read NMOS transistor is connected to the fuse through a third common node, and a second terminal of the second read NMOS transistor connected to the ground voltage, wherein a first terminal of the program transistor may be connected to the second terminal of the first read NMOS transistor through the second common node, and a second terminal of the program transistor is connected to the ground voltage, and wherein a first terminal of the fuse may be connected to the second common node between the first read NMOS transistor and the program transistor, and a second terminal of the fuse is connected to the second read NMOS transistor through the third common node.

The first common node may be placed between the first NMOS transistor and the second PMOS transistor, and wherein the gate node voltage may be configured to be supplied to a gate of the program transistor.

The program transistor may be an NMOS transistor.

The third common node between the second read NMOS transistor and the fuse may be connected to a program current controller, and wherein the program current controller may be configured to provide the program current.

The program transistor may be turned on, and the fuse may be programmed when a low signal is applied to the programmed state selection (BLOWB) signal, the write word line bar (WWLB) signal, and the read word line (RWL) signal, in a program operation implementing the eFuse cell.

A read current path may be formed through the first read NMOS transistor, the fuse, and the second read NMOS transistor, when a high signal is applied to the programmed state selection (BLOWB) signal, the write word line bar (WWLB) signal and the read word line (RWL) signal, in a read operation implementing the eFuse cell.

In a general aspect, an electrical fuse (eFuse) cell includes a first region comprising a first PMOS transistor, a second PMOS transistor, a first NMOS transistor, and a second NMOS transistor, and a second region comprising a program transistor, a first read NMOS transistor, a second read NMOS transistor, and a fuse; wherein a programmed state selection (BLOWB) signal is configured to be supplied to a gate of the first PMOS transistor and a gate of the first NMOS transistor, wherein a write word line bar (WWLB) signal is configured to be supplied to a gate of the second PMOS transistor, and wherein a read word line (RWL) signal is configured to be supplied to a gate of the first read NMOS transistor and a gate of the second read NMOS transistor.

The read word line (RWL) signal may be configured to execute a read operation.

The program transistor may be configured to control a program current to execute a fusing operation of the fuse.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
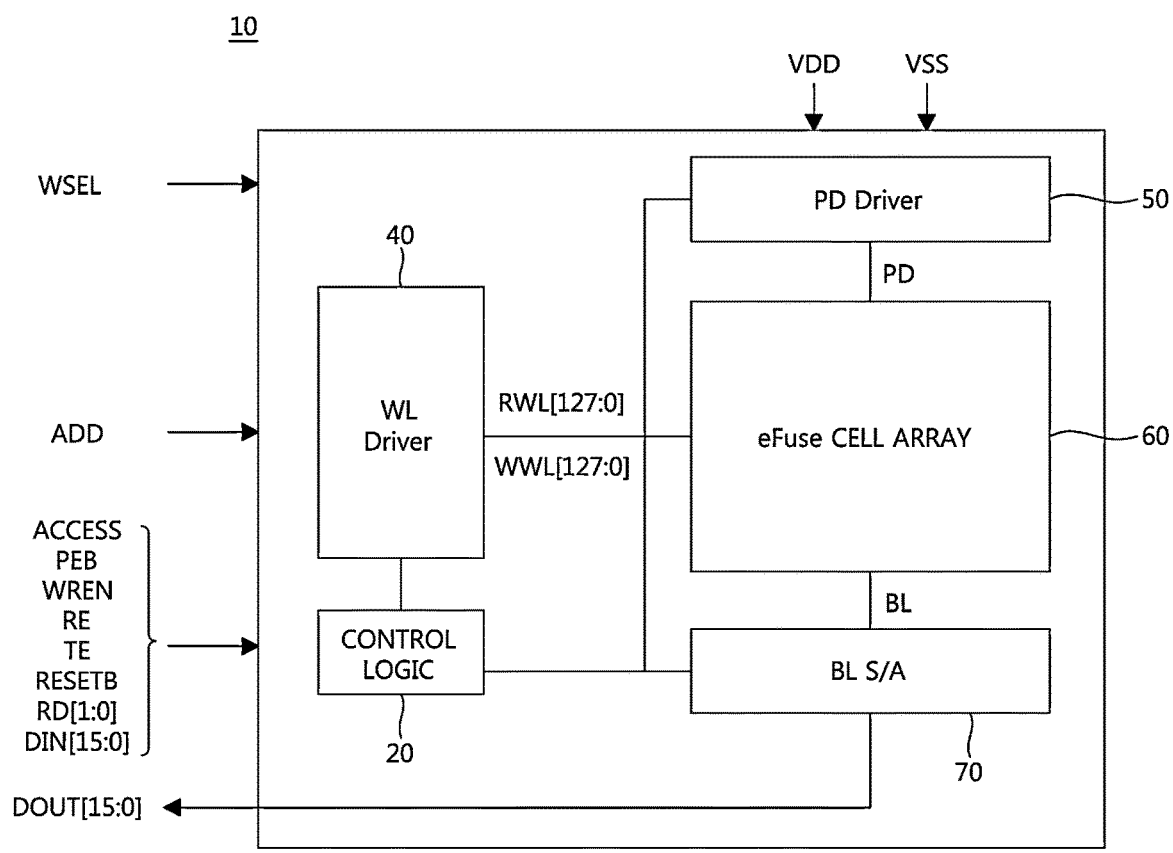
FIG. 1 illustrates an example block diagram of an example eFuse OTP memory, in accordance with one or more embodiments.

The following detailed description is supplied to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been supplied merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The disclosure is to solve the above problems and to provide an eFuse OTP memory that may design an area of an eFuse OTP memory cell smaller than traditional arts, by minimizing the number of transistors used inside an eFuse cell.

A detailed description for the disclosure is given below, based on embodiments shown in drawings.

FIG. 1 illustrates an example block diagram of an example eFuse OTP memory, in accordance with one or more embodiments.

An eFuse OTP memory 10, in accordance with one or more embodiments, may include a fuse-type cell array, which will be described below. Herein, a fuse refers to a fuse implementing a poly-silicon. Examples herein may include a programming method that is implemented by blowing a fuse by passing a high current to the fuse.

As illustrated in FIG. 1, an eFuse OTP memory 10 including a fuse type cell array of the examples may include a control logic 20, a word line driver (WL driver) 40, a programming current driver (or a program current driver, or, PD driver) 50, an eFuse cell ARRAY 60, a bit line sense AMP 70 (BL S/A) that receives a bit line (BL) etc. However, the examples are not limited thereto, and they may be replaced, and other compositions may be added.

Table 1 below illustrates a brief description of blocks 20, 40, 50, 60, and 70 included in an example eFuse OTP memory 10.

TABLE 1

| Block Name | Description |
| --- | --- |
| eFuse CELL ARRAY | eFuse cell array consists of an eFuse cell array of 128 rows × 16 columns. |
| WL Driver | WL driver activates one of 128 rows. |
| PD Driver | Programming driver supplies the programming current. The programming current is controlled by WSEL pins. |
| BL S/A | Bit line sense amplifier detects the data coming from the BL, and the data is output through the DOUT pins. |
| CONTROL LOGIC | Control logic supplies internal control signals which are suitable for programming, read or test mode. |

Referring to FIG. 1, a control logic 20 may supply an internal control signal that is suitable for a program mode or a read mode, according to a control signal. Additionally, the control logic 20 may supply a control signal to a word line driver 40, a program current driver (PD driver) 50, and a bit line sense AMP (BL S/A) 70. The word line driver 40 may include a word line selector, and it may activate a write word line bar (WWLB) signal or a read word line (RWL) signal. The program current driver 50 may include a bit line (BL) selector, and it may supply a program current controlled by WSEL pins.

An eFuse cell ARRAY 60 may include a plurality of eFuse unit cells. A bit line sense AMP 70 may detect digital data that are output from a bit line (BL), and the digital data may be output through an output terminal (DOUT).

Table 2 below provides a description for each pin illustrated in FIG. 1.

TABLE 2

| Port Name | I/O Type | Description |
| --- | --- | --- |
| ADD[6:0] | Input | Address pins for Word line selection |
| ACCESS | Input | For read or programming access (active high) |
| PEB | Input | Programming enable (active low) |
| RE | Input | Read enable (active high) |
| TE | Input | Fix low (N/A) |
| DIN[15:0] | Input | Data inputs Program data input (Only one DIN selectable to High in programming mode, 1 bit programming only possible) |
| DOUT[15:0] | Output | Data outputs Output data is latched until next read data comes to. |
| WSEL[3:0] | Input | Programming current control (active high) |
| RD[1:0] | Input | Read margin check control (default low) |
| RESETB | Input | Power-on reset (active low) RESTEB needs to be asserted once upon power up. This initialize IP's internal node, should be fixed high during operation mode. |
| WREN | Input | Write enable (active high) When 'H', programming operation is possible. 'L' protect programming. |

TABLE 2-continued

| Port Name | I/O Type | Description |
| --- | --- | --- |
| | | This can prevent programming malfunctions from unintended noise. |
| VDD | Supply | External supply power |
| VSS | Supply | Ground |

The RE and PEB terminals respectively refer to 'read enable' and 'program enable'. An ADD terminal is for an address selection in a word line driver 40 to activate a write word line bar (WWLB) signal or a read word line (RWL) signal. Additionally, a WSEL terminal controls a program current in a program current driver 50 to supply a program current. Power voltage (VDD) and ground voltage (VSS) terminals respectively supply a power voltage and a ground voltage.

A cell array form or a capacity of a cell array 60 is not limited to the examples. Examples may include a predetermined capacity having an arrangement of 128 rows*16 columns. That is, a cell array 60 may include 128 word lines and 16 bit lines (BL). Therefore, 2,048 bits may be included in a cell array 60 in total. 2,048 unit cells are arranged in a cell array 60.

In this example, one row may include one write word line bar (WWLB) signal and one read word line (RWL) signal. Therefore, there are 128 WWLBs and 128 RWLs. They may be alternately placed between a WWLB and a RWL, one by one. In one or more examples, a word line selector and a bit line (BL) selector may be needed to perform a programing of unit cells. One of 128 word lines (WL) and one of 16 bit lines (BL) may be successively selected through a row decoding and column decoding. Therefore, it may be said that the unit cell structure is operated with successively being selected.

Figure 2A:
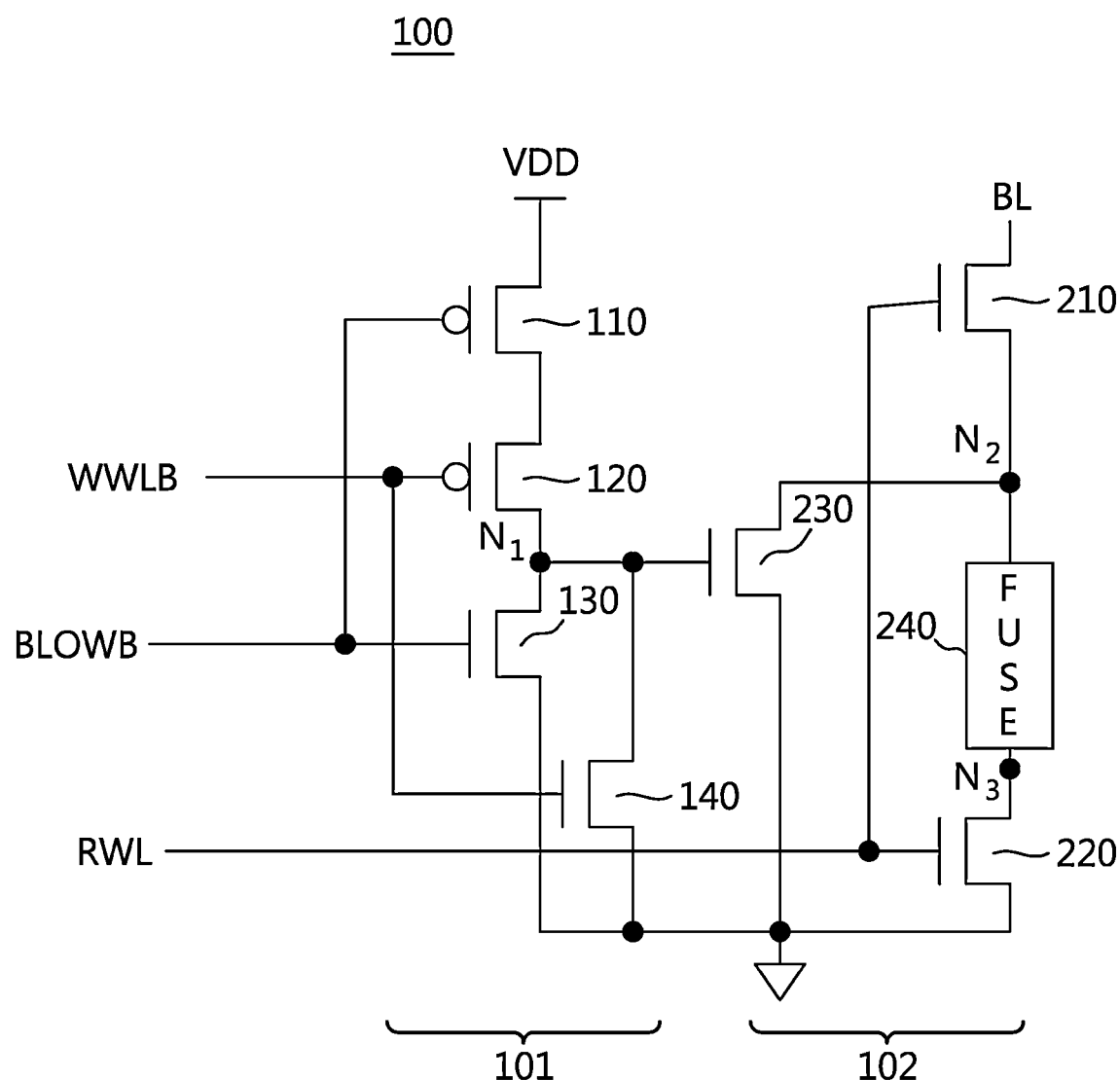
FIG. 2A illustrates an example circuit block diagram of an example eFuse cell included in an example eFuse OTP memory, in accordance with one or more embodiments.

FIG. 2A illustrates an example circuit block diagram of an example eFuse cell included in an eFuse OTP memory, in accordance with one or more embodiments.

With reference to FIG. 2A, an example eFuse cell 100, in accordance with one or more embodiments, may be divided into a first region 101 and a second region 102. The first region 101 may be considered to be a unit cell control block. In an example, the first region may be a region where control signals are input to operate a unit cell. The second region 102 may be considered to be a region where a write operation and a read operation are performed to a fuse 240 in a unit cell.

In one or more examples, the first region 101 may include a first PMOS transistor 110, a second PMOS transistor 120, a first NMOS transistor 130, and a second NMOS transistor 140.

A programmed state selection (BLOWB) signal may be supplied to a gate of the first PMOS transistor 110. A power voltage (VDD) may be supplied to a first terminal of the first PMOS transistor 110, and a second terminal of the first PMOS transistor 110 may be connected to the second PMOS transistor 120. A programmed state selection (BLOWB) signal may be supplied when a corresponding cell is selected by a programmed state selection (BLOWB) signal. When a corresponding cell is not programmed, a programmed state selection (BLOWB) signal may be blocked.

A write word line bar (WWLB) signal may be supplied to a gate of the second PMOS transistor 120. A first terminal of the second PMOS transistor 120 may be connected to the first PMOS transistor 110, and a first common node voltage may be supplied to a gate of the second PMOS transistor 110. A second terminal of the second PMOS transistor 120 may be connected to a first common node N1. When a write word line bar (WWLB) signal is supplied, the power voltage (VDD) from the first terminal of the first PMOS transistor 110 may be transmitted to the first common node N1, and the VDD is applied to a gate of a program transistor 230 to turn on the program transistor 230. A corresponding cell may perform a write operation to a fuse, that is, a blowing operation may be performed.

A programmed state selection (BLOWB) signal may be supplied to a gate of the first NMOS transistor 130, and a first terminal of the first NMOS transistor 130 may be connected to the second terminal of the second PMOS transistor 120, and a second terminal of the first NMOS transistor 130 may be connected to a ground voltage (VSS). In an example, a first common node N1 may be implemented between the first NMOS transistor 130 and the second PMOS transistor 120, and a first common node voltage may be output. The first common node voltage may be supplied to a gate of a program transistor 230. A first common node voltage may be a power voltage (VDD), and it may be, as, an example, 0V, a ground voltage (VSS).

The write word line bar (WWLB) signal may be supplied to a gate of the second NMOS transistor 140, and a first terminal of the second NMOS transistor 140 may be connected to a first common node N1, and a second terminal of the second NMOS transistor 140 may be connected to a ground voltage (VSS).

The second region 102 may include a first read NMOS transistor 210, a second read NMOS transistor 220, a program transistor 230, and a fuse 240.

In an example, a bit line signal (BL) may be supplied to a first terminal of the first read NMOS transistor 210, and a read word line (RWL) signal may be supplied to a gate of the first read NMOS transistor 210. A second terminal of the first read NMOS transistor 210 may be connected to the fuse 240 through a second common node N2. When a read word line (RWL) signal is supplied, a read operation may be performed.

A read word line (RWL) signal may be supplied to a gate of the second read NMOS transistor 220. A first terminal of the second read NMOS transistor 220 may be connected to the fuse 240 through a third common node N3, and a second terminal of the second read NMOS transistor 220 may be connected to the ground voltage (VSS).

A gate terminal of the program transistor 230 may be connected to a first common node N1 between the first NMOS transistor 130 and the second PMOS transistor 120. A drain terminal of the program transistor 230 may be connected to the second terminal of the first read NMOS transistor 210 through a second common node N2. That is, a drain terminal of the program transistor 230 may be connected to the second common node N2 between the first read NMOS transistor 210 and the fuse 240. Additionally, the second terminal (source terminal) of the program transistor 230 may be connected to the ground voltage (VSS). The program transistor 230 may be an NMOS transistor, and may be implemented to fuse or blow the fuse 240. Therefore, to flow a program current above a certain level, a corresponding channel width should be large in the program transistor 230.

In the fuse 240, a first terminal may be connected to the common connection terminal N2 between the first read NMOS transistor 210 and the program transistor 230, and a second terminal of the fuse 240 may be connected to the second read NMOS transistor 220 and a program power through a third common node N3. A program power may be supplied through a source line (SL) (see FIG. 3).

In one or more examples, an eFuse cell 100 may utilize 7 switching devices. However, the number of switches is not limited thereto. A cell area may be reduced because the one or more examples may implement fewer switching devices than typical eFuse cells. In FIG. 2A, switching devices may be an N-type metal-oxide semiconductor (NMOS) transistor and a P-type metal-oxide semiconductor (PMOS) transistor.

As illustrated in FIG. 2A, an eFuse cell 100 may include a first PMOS transistor 110 and a first NMOS transistor 130 which receive a programmed state selection (BLOWB) signal; a second PMOS transistor 120 and a second NMOS transistor 140 which receive a write word line bar (WWLB) signal to execute a program operation; a first read NMOS transistor 210 and a second read NMOS transistor 220 which receive a read word line (RWL) signal to execute a read operation; a program transistor 230 which controls a program current to flow for a fusing operation; and a fuse 240 connected between a first read NMOS transistor 210 and a second read NMOS transistor 220. In one or more examples, a program transistor 230 may control a massive amount of program current to flow for a fusing operation.

In the eFuse cell 100, a first PMOS transistor 110 and a first NMOS transistor 130 may receive a programmed state selection (BLOWB) signal through each respective gate terminal of the first PMOS transistor 110 and the first NMOS transistor 130.

The second PMOS transistor 120 and the second NMOS transistor 140 may receive a write word line bar (WWLB) signal to execute a program operation through each respective gate terminal of the second PMOS transistor 120 and the second NMOS transistor 140.

In an example, the first read NMOS transistor 210 and the second read NMOS transistor 220 may receive a read word line (RWL) signal through each respective gate terminal of the first read NMOS transistor 210 and the second read NMOS transistor 220.

In one or more examples, the first PMOS transistor 110, the second PMOS transistor 120, and the first NMOS transistor 130 may be connected in series with each other. Additionally, source terminals of the first NMOS transistor 130, the second NMOS transistor 140, the second read NMOS transistor 220, and the program transistor 230 may respectively be connected to the ground power (VSS).

Additionally, the third common node N3 between the second read NMOS transistor 220 and the fuse 240 may be connected to a program current driver 50, which was described in FIG. 1. A program current driver 50 may provide a program current.

Referring to FIG. 2A, in an eFuse cell 100, the fuse 240 may be connected between the first read NMOS transistor 210 and the second read NMOS transistor 220. A source terminal of the first read NMOS transistor 210 and a cathode of the fuse 240 may be connected, and a drain terminal of the second read NMOS transistor 220 and an anode of a fuse 240 may be connected. In a non-limiting example, the fuse 240 may be 1 bit memory device, and a resistance value of the fuse 240 may be changed by an overcurrent. In a non-limiting example, the fuse 240 may have a resistance value about below 300Ω before programming, and it may have a resistance value about over 3 kΩ after programming.

Table 3 below illustrates conditions for each signal in a program and read operation mode.

TABLE 3

| Signal | Program mode | | Read mode |
| --- | --- | --- | --- |
| | Selected | Unselected | |
| BLOWB | 0 V | VDD | VDD |
| WWLB | 0 V | VDD | VDD |
| RWL | 0 V | 0 V | VDD |

In an example, each signal process for a selected cell in a program mode may be as follows.

A programmed state selection (BLOWB) signal and a write word line bar (WWLB) signal for a program operation may be activated as a low. Therefore, when a low is applied to a programmed state selection (BLOWB) signal pin and a write word line bar (WWLB) signal pin for a program operation, switching devices may be turned on that are connected to a programmed state selection (BLOWB) signal and a write word line bar (WWLB) signal for a program operation.

Each signal process for an unselected cell in a program mode may be as follows. When a high is applied to a BLOWB pin and a WWBL pin, switching devices that are connected to a BLOWB and a WWLB may be turned off. Herein, the meaning of 'a low is applied' may mean, for example, 0V is applied, and the meaning of 'a high is applied' may mean that a VDD (power voltage) is applied. A pin may refer to a terminal that an input voltage or an output voltage is applied.

Each signal process for a read operation in a read mode may be as follows. Since a read word line (RWL) signal for a read operation may be activated as a high, corresponding switching devices may be turned on when a high is applied to a RWL pin. On the other hand, when a low is applied to a RWL, switching devices may be turned off that are connected to a RWL.

Figure 2B:
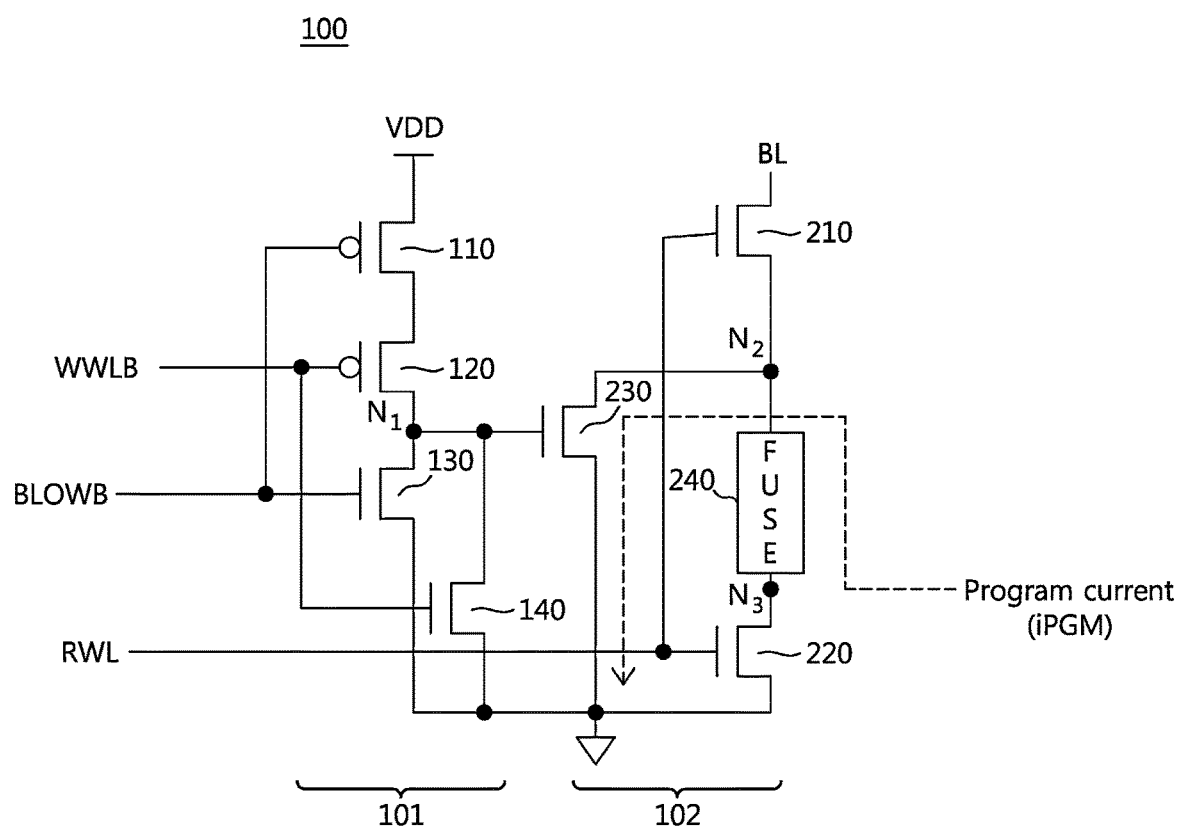
FIG. 2B illustrates an example program operation of an example eFuse cell according to a program mode, in accordance with one or more embodiments.

FIG. 2B illustrates an example program operation of an example eFuse cell according to a program mode, in accordance with one or more embodiments.

With reference to FIG. 2B, in a program operation for an example eFuse cell 100, a low may be applied to a BLOWB, WWLB, and RWL. In an example, 0V may be applied to a BLOWB, WWLB, and RWL.

In an example, a PMOS device connected to a BLOWB may be turned on, and an NMOS may be turned off. Therefore, a first PMOS transistor 110 may be turned on, and a first NMOS transistor 130 may be turned off. Additionally, a PMOS device connected to a WWLB may be turned on, and an NMOS may be turned off. A second PMOS transistor 120 may be turned on, and a second NMOS transistor 140 may be turned off. An NMOS may be turned off because 0V is applied to a RWL pin. A first read NMOS transistor 210 and a second read NMOS transistor 220 connected to a RWL pin may be turned off.

As a second PMOS transistor 120 is turned on, a power voltage (VDD) may be applied to a first common node N1. The power voltage (VDD) is transmitted from the first terminal of the first PMOS transistor 110. Accordingly, since a VDD may be applied to a gate terminal of a program transistor 230, a program transistor 230 may be turned on. Accordingly, a program current may flow along a dotted line. A program current that is supplied through a program current driver 50 may be delivered to a fuse 240 through a bit line (BL), and the fuse 240 may be fused, programmed, or blown by a program current. A fusing, programming, or blowing operation refers to an operation that raises a resistance of the fuse 240. A program current may flow from an anode of the fuse 240 to a cathode. Additionally, a program current may flow through a program transistor 230.

Figure 2C:
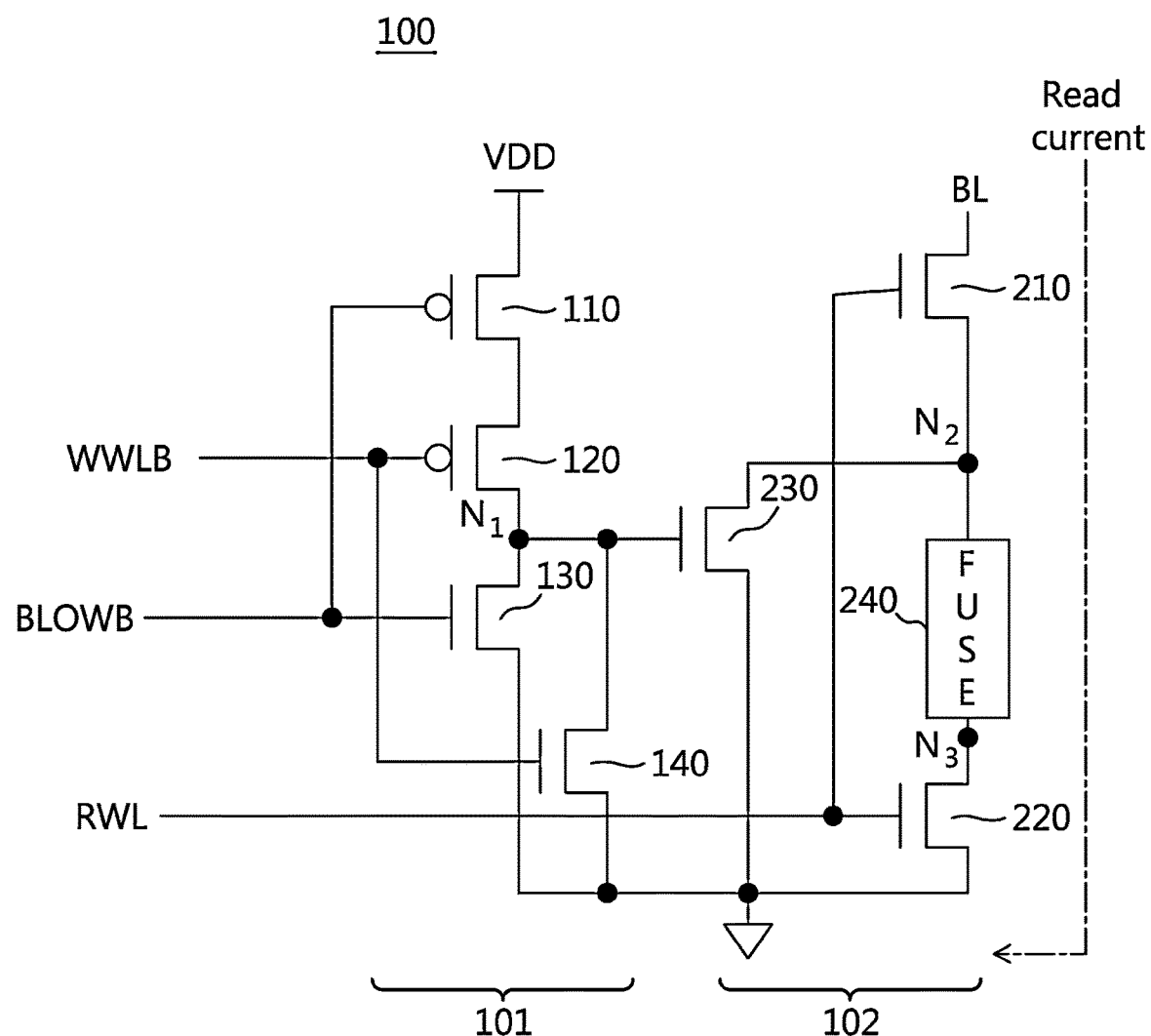
FIG. 2C illustrates an example read operation of an example eFuse cell according to a read mode, in accordance with one or more embodiments.

FIG. 2C illustrates an example read operation of an example eFuse cell according to a read mode, in accordance with one or more embodiments.

With reference to FIG. 2C, in a read operation for an eFuse cell 100, a high may be applied to a BLOWB, WWLB, and RWL. A power voltage (VDD) may be applied to a BLOWB, WWLB, and RWL. Then, contrary to a program operation, a first PMOS transistor 110, a second PMOS transistor 120, and a program transistor 230 may be turned off. Additionally, a first NMOS transistor 130, a second NMOS transistor 140, a first read NMOS transistor 210, and a second read NMOS transistor 220 may be turned on.

In an example, since the second NMOS transistor 140 is turned on because a power voltage (VDD) is applied to a BLOWB and WWLB, a gate voltage of the program transistor 230 may become a ground voltage. Therefore, a program transistor 230 may be turned off.

Since the first read NMOS transistor 210 and the second read NMOS transistor 220 are turned on, a read current path may be formed along an alternated long and short dash line. That is, a read current may flow along the first read NMOS transistor 210, e-fuse 240, and the second read NMOS transistor 220. As described, a read current may pass the fuse 240.

A read current may be changed in accordance with a resistance value of a fuse 240, and when a resistance is high because a fuse 240 is blown, a read current may become small. By converting the read current into a resistance or a voltage, a confirmation may be made whether a corresponding fuse 240 is programmed or not. Herein, a read current may flow from a cathode of the fuse 240 to an anode, which may flow in an opposite direction from a program current.

Figure 3:
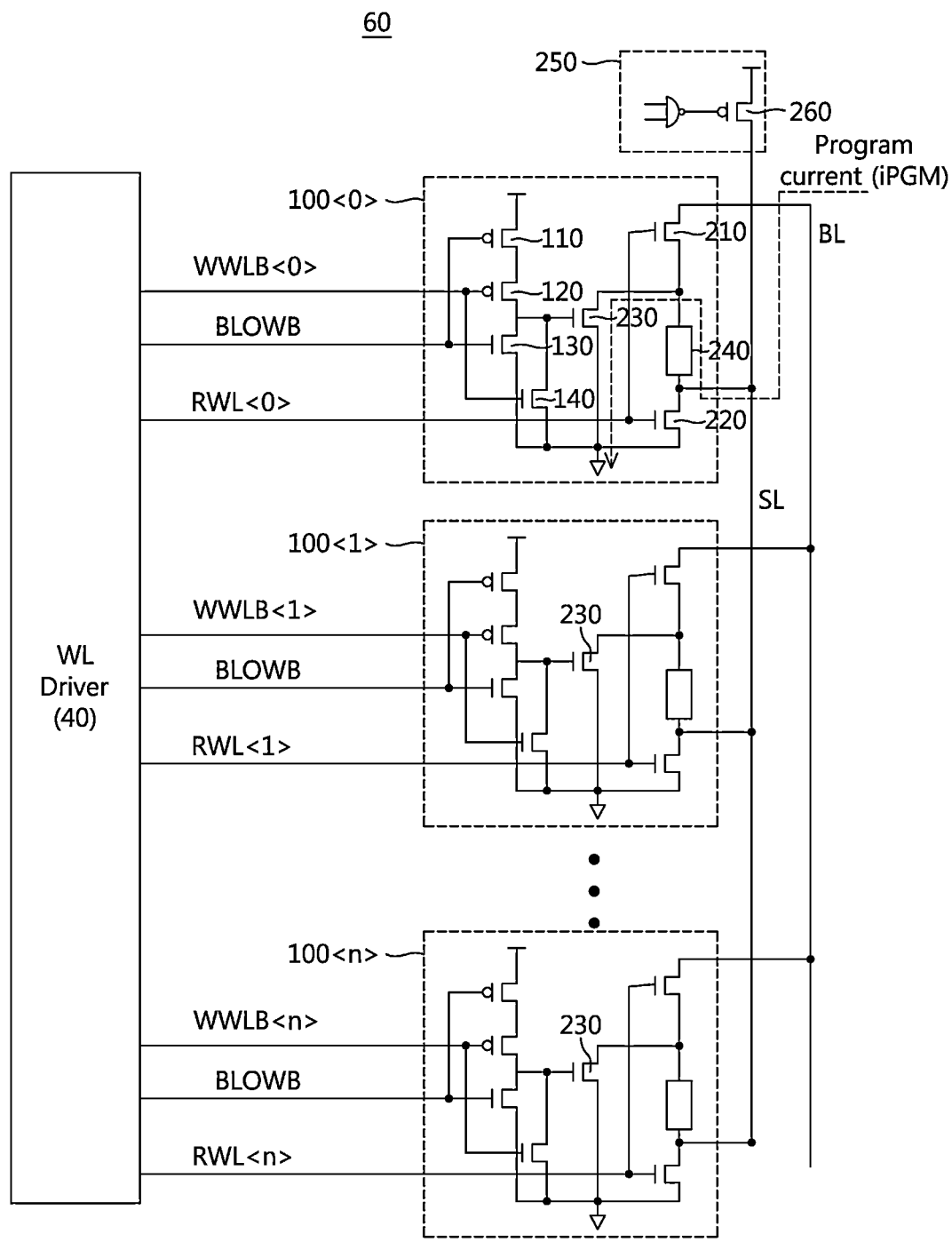
FIG. 3 illustrates an example program operation of an example eFuse cell array of an example eFuse OTP memory, in accordance with one or more embodiments.

FIG. 3 illustrates an example program operation of an example eFuse cell array of an eFuse OTP memory, in accordance with one or more embodiments.

Referring to FIG. 3, an eFuse OTP memory may include a plurality of eFuse cells (100<0>, 100<1>, 100<n>). Each eFuse cell (100<0>, 100<1>, 100<n>) may include a fuse 240 and 7 switching devices (that is, 2 PMOS transistors and 5 NMOS transistors). In this embodiment, the eFuse cells (100<0>, 100<1>, 100<n>) may be combined to create a cell array of 128R×16C. Each eFuse cell (100<0>, 100<1>, 100<n>) that composes an eFuse cell ARRAY (Cell array) may be isolated to be electrically separated from an adjacent eFuse cell.

In an example, a program current controller 250 may be connected to each eFuse cell (100<0>, 100<1>, 100<n>). The program current controller 250 may control a program current (iPGM) by a write voltage (Vpgm) to flow selectively to a plurality of eFuse cells (100<0>, 100<1>, 100<n>). In a write operation of an eFuse OTP memory, a switching device (for example, PMOS, 260) may be provided to selectively provide a write voltage to each eFuse cell (100<0>, 100<1>, 100<n>). In the switching device 260, a write voltage (approximately 3.6V~5.5V, as an example) may be input to a source of the switching device 260, and a write control signal may be input to a gate of the switching device 260, and a drain terminal of the switching device 260 may be connected to an anode of the fuse 240. A write voltage (Vpgm) may be delivered through a source line (SL).

A write operation of an eFuse OTP memory is described with referring to FIG. 3. A word line driver 40 may select an eFuse cell (for example, 100<0>) that performs a write operation, and selection signals may be provided to the selected eFuse cell (100<0>). Selection signals refer to a BLOWB, WWLB, and RWL. A low may be applied to a line connected to those signals. In an example, 0V may be applied. When a BLOWB is a low, and WWLB<0> is selected as a low, a current may flow through a program transistor 230, and therefore, a program current (iPGM) may program a fuse 240.

As described above, when a low is applied to a WWLB<0> that is activated in a low level, the first PMOS transistor 110 and the second PMOS transistor 120 may be turned on, and hereupon, the program transistor 230 may also be turned on. On the other hand, the first NMOS transistor 130, the second NMOS transistor 140, the first read NMOS transistor 210 and the second read NMOS transistor 220, which are other switching devices, may be turned off.

Therefore, for a program current (iPGM) provided by a program current controller 250, a current path (arrow) may be formed that flows through the fuse 240 and the program transistor 230. Since a program current (iPGM) flows through a current path, a predetermined information may be programmed in a fuse 240. A programmed fuse may have a high resistance, about over 3 kΩ.

In other unselected cells (100<1>, 100<n>), a WWLB<1>, a WWLB<n>, etc. may remain as a high in a WLDRV, and a program transistor 230 placed in other unselected cells (100<1>, 100<n>) may be turned off, therefore blocking a program. That is, a VDD may be applied to a WWLB terminal, and 0V may be applied to a RWL terminal. Then, the first PMOS transistor 110 or the second PMOS transistor 120 may be turned off. Instead, by turning on the second NMOS transistor 140, charges of a gate of the program transistor 230 may be discharged, and a voltage at a gate of the program transistor 230 may become 0V. Thus, the program transistor 230 may be turned off. A program current may not flow because the program transistor 230 is turned off. The fuse 240 may not be fused or blown in other unselected cells (100<1>, 100<n>). Herein, only a second NMOS transistor may be turned on. A first read NMOS transistor 210 and a second read NMOS transistor 220, which are other switching devices, may be also turned off.

Figure 4:
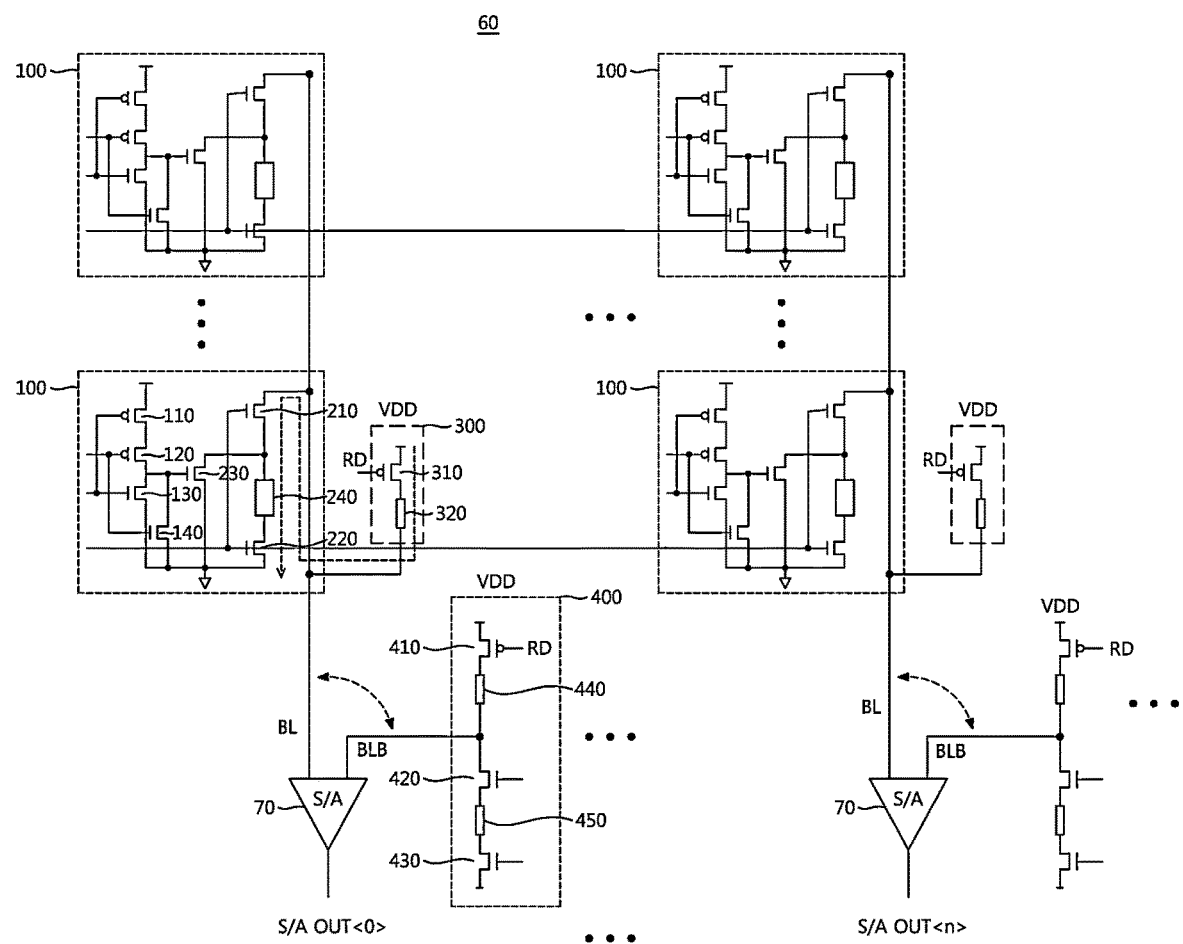
FIG. 4 illustrates an example read operation of an example eFuse cell array of an example eFuse OTP memory, in accordance with one or more embodiments.

FIG. 4 illustrates an example read operation of an example eFuse cell array of an eFuse OTP memory, in accordance with one or more embodiments.

Referring to FIG. 4, an eFuse OTP memory includes a plurality of eFuse cells 100, and each eFuse cell 100 includes 7 switching devices (that is, 2 PMOS transistors and 5 NMOS transistors) and a fuse 240. A read operation may be performed along with a current path through a first read NMOS transistor 210, a fuse 240, and a second read NMOS transistor 220.

A read current controller (read current unit) 300 may be implemented to provide a read voltage to a plurality of eFuse cells 110 to perform a read operation. A read current controller 300 may be configured with a read current control transistor 310 and a read current control resistance 320. A source terminal of the read current control transistor 310 may receive an input voltage. A gate of the read current control transistor 310 may receive a reversed read control signal. A drain terminal of the read current control transistor 310 may be connected to one end of the read current control resistance 320. Therefore, in a read operation of an eFuse OTP memory, a read voltage may be selectively provided to a plurality of eFuse cells 100.

Herein, a read current control resistance 320 may have a first predetermined resistance value. Additionally, a first end of the read current control resistance 320 may be connected to a drain terminal of the read current control transistor 310, and a second end of the read current control resistance 320 may be connected to a drain terminal of the first read NMOS transistor 210 of an eFuse cell 100 in common. It may also be connected to a bit line sense AMP 70. Herein, the read current control resistance 320 may have a median value (about 1.6KΩ) between an unprogrammed resistance value (below 300Ω) and the programmed minimum resistance value (3KΩ).

A reference voltage generator 400 may be equipped to generate a reference voltage (Vref) and compare the generated reference voltage with a voltage through the fuse 240 of an eFuse cell 100. A reference voltage generator 400 may be composed of 3 switching devices and 2 resistances, and it may distribute a read voltage by implementing a plurality of resistances connected in series, and generate the distributed voltage as a reference voltage.

More specifically, a first reference voltage generation transistor 410, a second reference voltage generation transistor 420, and a third reference voltage generation transistor 430 may be electrically connected in series with each other. A first reference voltage generation resistance 440 may be placed between the first reference voltage generation transistor 410 and the second reference voltage generation transistor 420. A second reference voltage generation resistance 450 may be placed between the second reference voltage generation transistor 420 and the third reference voltage generation transistor 430.

A source terminal of the first reference voltage generation transistor 410 may receive a read voltage. A gate of the first reference voltage generation transistor 410 may receive a reversed read control signal. A drain terminal of the first reference voltage generation transistor 410 may be connected to one end of the first reference voltage generation resistance 440. In an example, the first reference voltage generation transistor 410 may be a PMOS transistor that selectively provides a read voltage to the first reference voltage generation resistance 440.

The second reference voltage generation transistor 420 may selectively connect the first reference voltage generation resistance 440 and the second reference voltage generation resistance 450. That is, a drain terminal of the second reference voltage generation transistor 420 may be connected to the first reference voltage generation resistance 440 and a bit line sense AMP 70 in common. A gate of the second reference voltage generation transistor 420 may receive a read control signal. A source terminal of the second reference voltage generation transistor 420 may be connected to the second reference voltage generation resistance 450. In an example, the second reference voltage generation transistor 420 may be an NMOS transistor.

A drain terminal of the third reference voltage generation transistor 430 may be connected to the second reference voltage generation resistance 450. A gate of the third reference voltage generation transistor 430 may receive a read control signal. A source terminal of the third reference voltage generation transistor 430 may be grounded. In an example, the third reference voltage generation transistor 430 may be an NMOS transistor that makes a current flow to the first reference voltage generation resistance 440 and the second reference voltage generation resistance 450, by a read voltage.

In an example, the two resistances equipped in the reference voltage generator 400, that is, the first reference voltage generation resistance 440 and the second reference voltage generation resistance 450, may respectively include a predetermined resistance value. Each resistance value may have a median value (for example, 1.5 k~5 kΩ) between an unprogrammed resistance value of a fuse 240 (for example, about 50~250Ω) and the minimum programmed resistance value (for example, about 3 k~10 kΩ).

The bit line sense AMP 70 may receive two voltage values and compare them. The first voltage value may be a voltage ($V_{BL}$) delivered from a bit line (BL) of a programmed cell. The second voltage value may be a voltage ($V_{ref}$) delivered from a bit line (BLB) related to a reference voltage. The bit line sense AMP 70 may compare a first voltage through the fuse 240 of an eFuse cell 100 selected by a read voltage and a reference voltage ($V_{ref}$) generated by a reference voltage generator 400, and it may output the difference. According to an output result, a selected fuse 240 may be considered to be programmed when a voltage ($V_{BL}$) through the fuse 240 is greater than a reference voltage generated by a reference voltage generator 400. When a voltage ($V_{BL}$) through the fuse 240 is less than a reference voltage generated by a reference voltage generator 400, the fuse 240 is considered not to be programmed.

Referring again to FIG. 4, a read operation of an eFuse OTP memory is described.

A word line driver 40 may select an eFuse cell 100 to perform a read operation, and provide a signal, such as a BLOWB, WWLB, and RWL, etc., to the selected eFuse cell 100, where a high is applied. Then, since a high is applied to a terminal of a BLOWB, WWLB, and RWL, the first PMOS transistor 110, the second PMOS transistor 120, and the program transistor 230 may be turned off. The first NMOS transistor 130, the second NMOS transistor 140, the first read NMOS transistor 210, and the second read NMOS transistor 220 may be turned on.

A control logic 20 may subsequently provide a read voltage to the selected eFuse cell 100, and provide a read control signal by operating a read current controller 300. Accordingly, a read current control transistor to a third reference voltage generation transistor 310, 410, 420 and 430 may be turned on. In turning on a read current control transistor to the third reference voltage generation transistor 310, 410, 420 and 430, a current path (arrow) may be formed to pass the read current control transistor 310, the first read current control resistance 320, the first read NMOS transistor 210, the fuse 240, and the second read NMOS transistor 220.

Additionally, a current path may be formed to pass the first reference voltage generation transistor 410, the first reference voltage generation resistance 440, the second reference voltage generation transistor 420, the second reference voltage generation resistance 450, and the third reference voltage generation transistor 430.

Since the number of switching devices via the current path may be the same, it may be possible to decide whether a resistance value of the fuse 240 is above a reference voltage or not, with excluding characteristics of a switching device. In an example, before the fuse 240 is programmed, the fuse 240 may include a resistance value lower than a resistance value of the second reference voltage generation resistance 450, and a voltage at the fuse 240 may be lower than a voltage distributed by the second reference voltage generation resistance 450.

On the contrary, when the fuse 240 is programmed, the fuse 240 may include a resistance value higher than a resistance value of the second reference voltage generation resistance 450, and a voltage at the fuse 240 may be higher than a voltage distributed by the second reference voltage generation resistance 450. Therefore, a bit line sense AMP 70 may decide whether the fuse 240 is programmed or not, by comparing a voltage of the fuse 240 with a reference voltage.

Additionally, for unselected cells in a read mode, a low may be applied to a RWL terminal. When 0V is applied to a RWL terminal, a first read NMOS transistor 210 and a second read NMOS transistor 220 may be turned off, and therefore, they do not perform a read operation.

Figure 5:
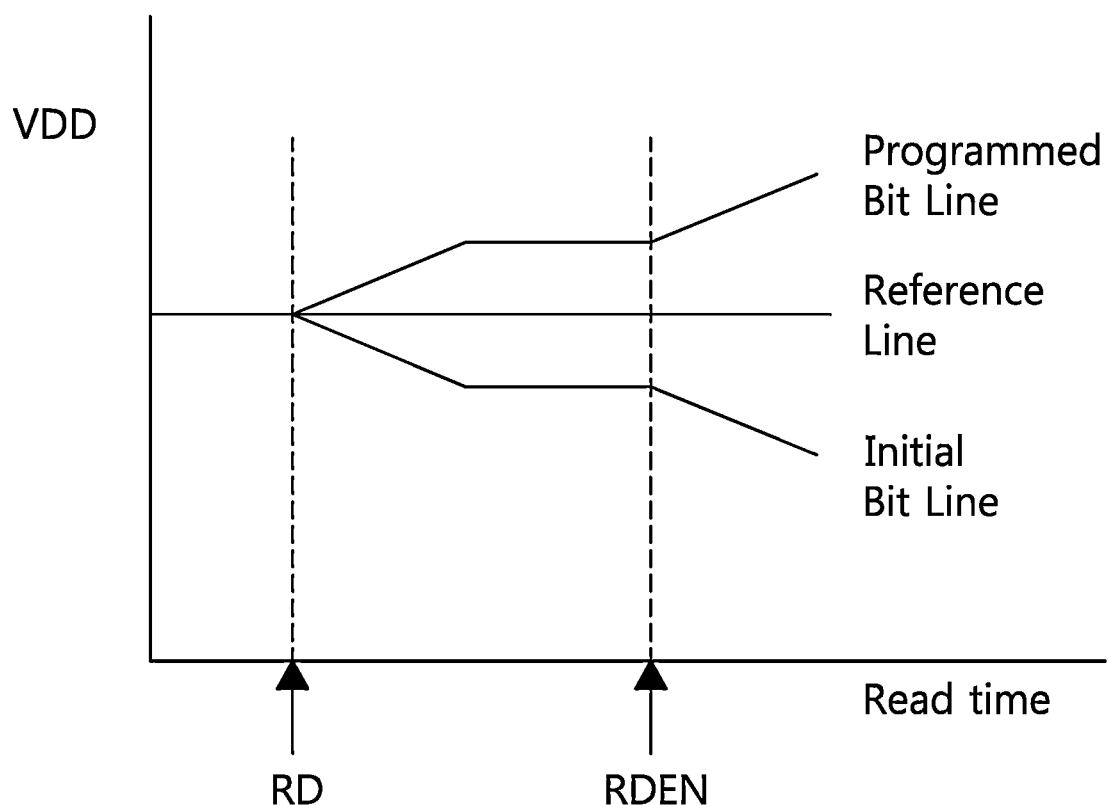
FIG. 5 illustrates an example voltage graph of a bit line based on a read time in an example eFuse OTP memory, in accordance with one or more embodiments.

FIG. 5 illustrates an example voltage graph of a bit line based on to a read time in an example eFuse OTP memory, in accordance with one or more embodiments.

Referring to FIG. 5, a reference line may refer to a reference voltage ($V_{ref}$) generated in a reference voltage generator 400. A voltage of a bit line through a programmed fuse 240 (programmed bit line) may be larger than a reference line. On the other hand, a voltage of an initial bit line before being programmed may be smaller than a reference line. When a voltage through a fuse 240 is greater than a reference voltage generated in a reference voltage generator 400, a selected fuse 240 may be considered to be programmed. When a result is opposite, a selected fuse 240 is considered not to be programmed.

Figure 6:
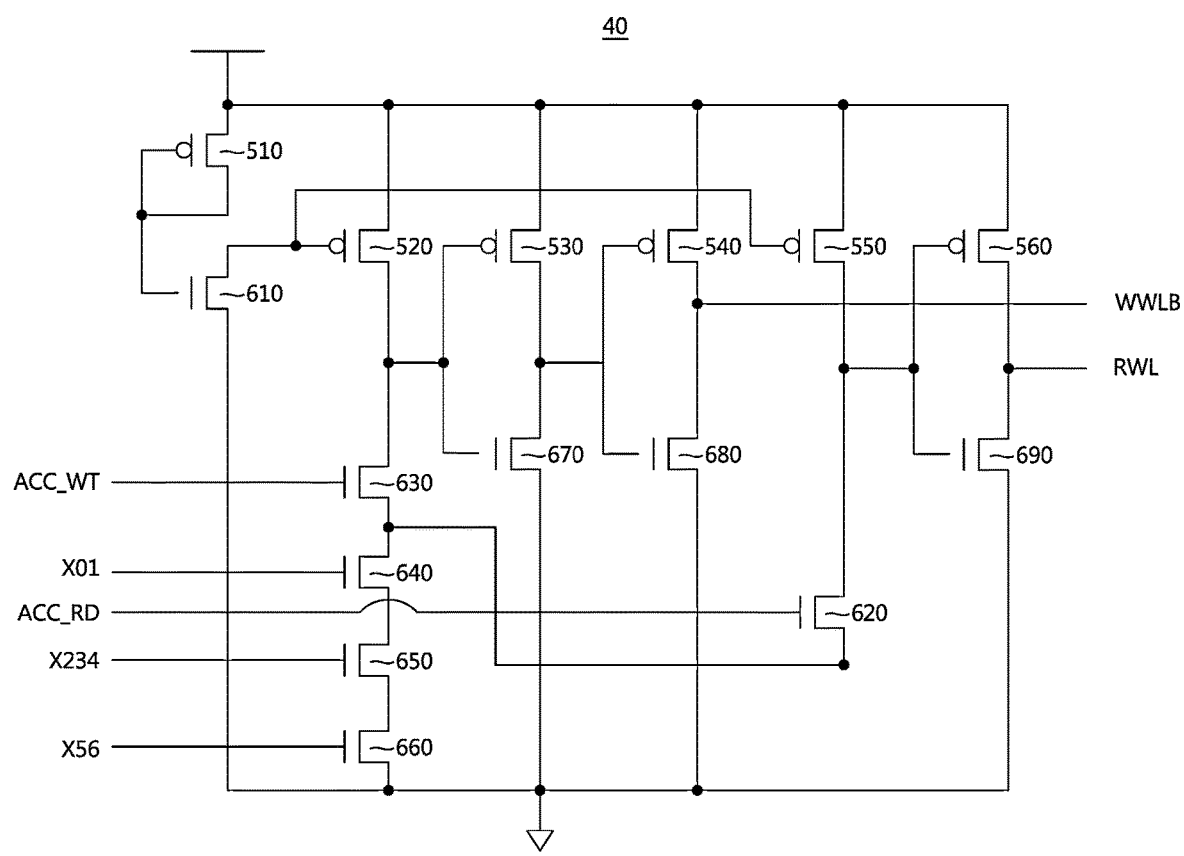
FIG. 6 illustrates an example circuit block diagram of a word line driver of an example eFuse OTP memory, in accordance with one or more embodiments.

FIG. 6 illustrates an example circuit block diagram of a word line driver of an eFuse OTP memory, in accordance with one or more embodiments.

A write word line bar (WWLB) signal for a program operation and a RWL signal for a read operation should be applied in an eFuse cell 100, and typically, word line drivers for a program operation and a read operation may be implemented separately. However, when word line drivers for a program operation and a read operation are all provided, a circuit composition becomes complicated. The examples simplify a circuit composition of a word line driver.

A word line driver 40 in accordance with one or more examples, may activate a write word line bar (WWLB) signal or a read word line (RWL) signal. In an example of an address disable, a circuit composition of a word line driver 40 may make a WWLB signal maintain a high level state and a RWL signal maintain a low level state always, preventing an activation of a word line.

On the contrary, when a program master pulse, an ACC_WT becomes a high level, a WWLB signal may be activated during a corresponding pulse section. When a read master pulse, an ACC_RD becomes a high level, a RWL signal may be activated during a corresponding pulse section. That is, when an ACC_WT becomes a high level, a WWBL may be provided, and a RWL signal may be provided when an ACC_RD becomes a high level.

Referring to FIG. 6, a circuit composition of a word line driver 40 is described. As illustrated, a word line driver 40 may include at least 6 PMOS transistors, at least 9 NMOS transistors, and control signals. In an example, a word line driver 40 may include a first to a sixth PMOS 510-560, and a first to a ninth NMOS 610-690. To avoid confusion with a PMOS transistor or an NMOS transistor of an eFuse cell, the PMOS 510-560, and the NMOS 610-690 may be referred to as WLDRV PMOS and WLDRV NMOS, or driver PMOS and driver NMOS. They are simply referred to as PMOS or NMOS below.

More specifically, referring to FIG. 6, a first PMOS 510 and a first NMOS 610 are included. The first PMOS 510 and the first NMOS 610 may be a tie down circuit. A source of the first PMOS 510 may be connected to a power terminal, and a drain terminal of the first PMOS 510 may be connected to a gate of the first PMOS 510 and a gate of the first NMOS 610 in common.

A source terminal of the second to the sixth PMOS 520-560 may be connected between a power voltage (VDD) terminal and the first PMOS 510 in common. A gate of the second PMOS 520 may be connected to a gate of the fifth PMOS 550.

The third to the sixth NMOS 630-660 may be connected to the second PMOS 520. A different control signal may be input respectively in a gate of the NMOS 630-660. A program master pulse, an ACC_WT signal, may be applied to a third NMOS 630. When an ACC_WT signal is a high level, a third NMOS 630 may be turned on. When an ACC_WT, which is a program master pulse delivered from a control logic 20, becomes a high, a WWLB may be provided during a corresponding pulse section. A corresponding pulse section refers to a pulse section for a program operation, or it may be a program (write) pulse section.

Additionally, in the fourth to the sixth NMOS 640-660, signals may be respectively applied that are address pre decoded in a control block such as X01, X234, X56. When those X01, X234, X56 become a high level corresponding to each address, the fourth to the sixth NMOS 640-660 may be turned on.

Additionally, the second NMOS 620 may be connected to the fifth PMOS 550. A read master pulse, an ACC_RD signal, may be applied to a gate of the second NMOS 620, and when an ACC_RD signal is a high level, the second NMOS 620 may be turned on. When an ACC_RD, which is a read master pulse delivered from a control logic 20, becomes a high, a RWL signal may be provided during a corresponding pulse section. A corresponding pulse section refers to a pulse section for a read operation, or it may be a read operation pulse section.

According to FIG. 6, the seventh NMOS 670 may be connected to a drain terminal of the third PMOS 530. The eighth NMOS 680 may be connected to a drain terminal of the fourth PMOS 540. A ninth NMOS 690 may be connected to a sixth PMOS 560.

A combination of those transistors may be a form of a CMOS transistor, and it may be referred to as a first, a second, and a third CMOS transistor. A first CMOS transistor may include the third PMOS 530 and the seventh NMOS 670. A second CMOS transistor may include the fourth PMOS 540 and the eighth NMOS 680. A third CMOS transistor may include the sixth PMOS 560 and the ninth NMOS 690.

According to FIG. 6, the fourth PMOS 540 and the eighth NMOS 680, that is, the second CMOS transistor may output a WWLB signal, and the sixth PMOS 560 and the ninth NMOS 690, that is, the third CMOS transistor may output a RWL signal. A WWLB signal, which is a low level active signal, and a RWL signal, which is a high level active signal, may be applied to an eFuse cell 100 in accordance with a write/write operation mode.

As shown, a word line driver 40 may provide a WWLB signal that is a low level active signal for a program operation. Also, it may generate a RWL signal that is a high level active signal for a read operation and apply them to an eFuse cell 100.

Figure 7A:
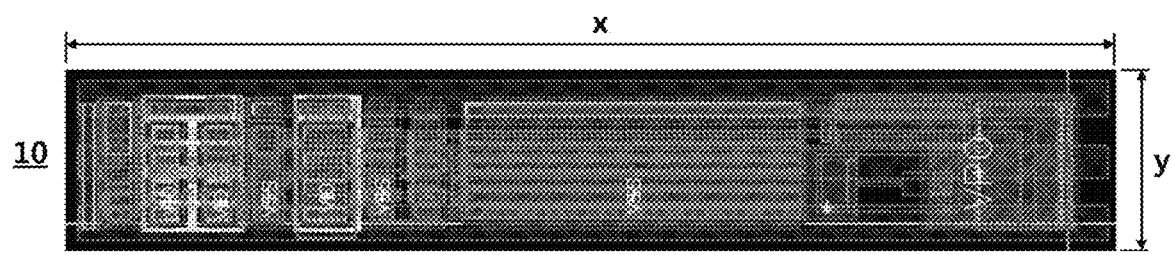
FIG. 7A and FIG. 7B illustrate example layouts to compare an area of a typical eFuse cell and an area of an example eFuse OTP memory, in accordance with one or more embodiments.
Figure 7B:
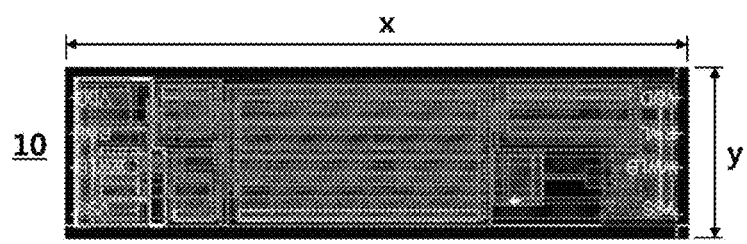

FIGS. 7A and 7B are layouts to compare areas of a typical eFuse cell and an eFuse cell of the examples. For a switching device that includes an eFuse cell, 16 switching devices may typically be used. However, in the examples, a circuit may include only 7 switching devices. The number of switching devices may be reduced nearly by half.

Comparing an area of an eFuse cell, a typical eFuse cell of FIG. 7A may have an area of 39.1 μm×4.8 μm (width× height), and an eFuse cell of the example of FIG. 7B may have an area of 24 μm×4.63 μm (width×height). Accordingly, the area of the example illustrated in FIG. 7B may be reduced by 40% when compared to an area of a typical eFuse cell, and therefore, an entire area of a cell array of the one or more examples may be reduced by 40%.

According to an eFuse memory device of the examples described herein, an area of an eFuse cell may be much smaller by composing an eFuse cell, a unit cell of a fuse-type cell array, with fewer switching devices than typical eFuse cells. Additionally, since an area of an eFuse cell may be reduced, an entire area of a memory device may also be reduced.

Therefore, a layout of a memory device may become flexible, and a competitiveness may be enhanced by reducing an area of a memory device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electrical fuse (eFuse) One Time Programmable (OTP) memory comprising an eFuse cell, the eFuse cell comprising:
   a first PMOS transistor and a first NMOS transistor configured to receive a programmed state selection (BLOWB) signal;
   a second PMOS transistor and a second NMOS transistor configured to receive a write word line bar (WWLB) signal to execute a program operation;
   a first read NMOS transistor and a second read NMOS transistor configured to receive a read word line (RWL) signal to execute a read operation;
   a fuse connected between the first read NMOS transistor and the second read NMOS transistor; and
   a program transistor configured to control a flow of a program current to program the fuse.

2. The eFuse OTP memory of claim 1,
   wherein the program transistor is turned on and the fuse is programmed when a low signal is applied to the programmed state selection (BLOWB) signal, the write word line bar (WWLB) signal, and the read word line (RWL) signal, in a program operation implementing the eFuse cell.

3. The eFuse OTP memory of claim 1,
   wherein a read current path is formed through the first read NMOS transistor, the fuse, and the second read NMOS transistor, when a high voltage is applied to the programmed state selection (BLOWB) signal, the write word line bar (WWLB) signal and the read word line (RWL) signal, in a read operation implementing the eFuse cell.

4. The eFuse OTP memory of claim 1, further comprising:
   a word line driver,
   wherein the word line driver is configured to activate the write word line bar (WWLB) signal and the read word line (RWL) signal and supply the activated write word line bar (WWLB) signal and the activated read word line (RWL) signal to the eFuse cell, and
   wherein the write word line bar (WWLB) signal maintains a high level state, and the read word line (RWL) signal maintains a low level state in an address disable state.

5. An electrical fuse (eFuse) One Time Programmable OTP memory, comprising:
   an eFuse cell comprising a first region and a second region,
   wherein the first region comprises a first PMOS transistor, a second PMOS transistor, a first NMOS transistor, and a second NMOS transistor,
   wherein a programmed state selection (BLOWB) signal is configured to be supplied to a gate of the first PMOS transistor, and a power voltage is configured to be supplied to a first terminal of the first PMOS transistor, and a second terminal of the first PMOS transistor is connected to the second PMOS transistor,
   wherein a write word line bar (WWLB) signal is configured to be supplied to a gate of the second PMOS transistor, and a first terminal of the second PMOS transistor is connected to the first PMOS transistor, and a second terminal of the second PMOS transistor is connected to a first common node,
   wherein the programmed state selection (BLOWB) signal is configured to be supplied to a gate of the first NMOS transistor, and a first terminal of the first NMOS transistor is connected to the second PMOS transistor, and a second terminal of the first NMOS transistor is connected to a ground voltage, and
   wherein the write word line bar (WWLB) signal is configured to be supplied to a gate of the second NMOS transistor, and a first terminal of the second NMOS transistor is connected to the first common node, and a second terminal of the second NMOS transistor is connected to the ground voltage.

6. The eFuse OTP memory of claim 5,
   wherein the second region comprises a first read NMOS transistor, a second read NMOS transistor, a program transistor, and a fuse,
   wherein a read word line (RWL) signal is configured to be supplied to a gate of the first read NMOS transistor, and a bit line signal is configured to be supplied to a first terminal of the first read NMOS transistor, and a second terminal of the first read NMOS transistor is connected to the fuse through a second common node,
   wherein the read word line (RWL) signal is configured to be supplied to a gate of the second read NMOS transistor, and a first terminal of the second read NMOS transistor is connected to the fuse through a third common node, and a second terminal of the second read NMOS transistor connected to the ground voltage, wherein a first terminal of the program transistor is connected to the second terminal of the first read NMOS transistor through the second common node, and a second terminal of the program transistor is connected to the ground voltage, and wherein a first terminal of the fuse is connected to the second common node between the first read NMOS transistor and the program transistor, and a second terminal of the fuse is connected to the second read NMOS transistor through the third common node.

7. The eFuse OTP memory of claim 6, wherein the first common node is placed between the first NMOS transistor and the second PMOS transistor, and wherein the gate node voltage is configured to be supplied to a gate of the program transistor.

8. The eFuse OTP memory of claim 6, wherein the program transistor is an NMOS transistor.

9. The eFuse OTP memory of claim 6, wherein the third common node between the second read NMOS transistor and the fuse is connected to a program current controller, and wherein the program current controller is configured to provide a program current.

10. The eFuse OTP memory of claim 6, wherein the program transistor is turned on, and the fuse is programmed when a low signal is applied to the programmed state selection (BLOWB) signal, the write word line bar (WWLB) signal, and the read word line (RWL) signal, in a program operation implementing the eFuse cell.

11. The eFuse OTP memory of claim 5, wherein a read current path is formed through the first read NMOS transistor, the fuse, and the second read NMOS transistor, when a high signal is applied to the programmed state selection (BLOWB) signal, the write word line bar (WWLB) signal and the read word line (RWL) signal, in a read operation implementing the eFuse cell.

12. An electrical fuse (eFuse) cell, comprising:

a first region comprising a first PMOS transistor, a second PMOS transistor, a first NMOS transistor, and a second NMOS transistor, and a second region comprising a program transistor, a first read NMOS transistor, a second read NMOS transistor, and a fuse;

wherein a programmed state selection (BLOWB) signal is configured to be supplied to a gate of the first PMOS transistor and a gate of the first NMOS transistor, wherein a write word line bar (WWLB) signal is configured to be supplied to a gate of the second PMOS transistor, and wherein a read word line (RWL) signal is configured to be supplied to a gate of the first read NMOS transistor and a gate of the second read NMOS transistor.

13. The eFuse cell of claim 12, wherein the read word line (RWL) signal is configured to execute a read operation.

14. The eFuse cell of claim 12, wherein the program transistor is configured to control a program current to execute a fusing operation of the fuse.

* * * * *